(12) United States Patent
Higashi

(10) Patent No.: US 7,955,974 B2
(45) Date of Patent: Jun. 7, 2011

(54) FORMATION OF A THROUGH-ELECTRODE BY INKJET DEPOSITION OF RESIN PASTES

(75) Inventor: Kazushi Higashi, Osaka (JP)

(73) Assignee: Panasonic Corporation, Osaka (JP)

( * ) Notice: Subject to any disclaimer, the term of this patent is extended or adjusted under 35 U.S.C. 154(b) by 141 days.

(21) Appl. No.: 12/432,185

(22) Filed: Apr. 29, 2009

(65) Prior Publication Data
US 2009/0280647 A1 Nov. 12, 2009

(30) Foreign Application Priority Data
May 12, 2008 (JP) .................................. 2008-124122

(51) Int. Cl.
H01L 21/44 (2006.01)
(52) U.S. Cl. .................................. 438/667; 257/E21.597
(58) Field of Classification Search .................. 438/667; 257/E21.597
See application file for complete search history.

(56) References Cited

U.S. PATENT DOCUMENTS
2004/0155355 A1* 8/2004 Hanaoka et al. ............... 257/777
2008/0224271 A1* 9/2008 Sogawa et al. ................ 257/621
* cited by examiner Primary Examiner — Hsien-ming Lee
Assistant Examiner — Kevin Parendo
(74) Attorney, Agent, or Firm — Steptoe & Johnson LLP

(57) ABSTRACT

When forming a resin material in a through hole, an electrode pad is formed in the bottom portion of the through hole, an insulating material is formed about the periphery of the through hole and a conductive material is formed in the central portion by an inkjet method, inkjet-ejected resins being ejected in such a manner that concavo-convex indentations and projections are formed in the surface thereof, whereby the adhesiveness between the insulating material and the conductive material and the adhesiveness between the insulating material and the inner walls of the through hole can be improved. Therefore, it is possible to suppress mechanical defects such as detachment of conductive material at the interfaces between the inner surface of the through hole and the resin or conductor layer, or electrical defects such as insulation defects, conduction defects, or the like.

8 Claims, 6 Drawing Sheets

FORMATION OF A THROUGH-ELECTRODE BY INKJET DEPOSITION OF RESIN PASTES

BACKGROUND OF THE INVENTION

1. Field of the Invention

The present invention relates to a semiconductor through-electrode forming method for forming an electrode path from the front surface to the rear surface of a semiconductor IC.

2. Description of the Related Art

In a semiconductor IC in which an semiconductor element is formed on the front surface of a substrate, the electrical connection from an electrode of the semiconductor element to an electrode pad which forms an external electrode on the rear surface of the substrate may be made via a through-electrode which is formed by filling a conductive resin into a through hole formed in the substrate.

Conventionally, in order to form a through-electrode, a hole passing through the substrate, such as a silicon substrate, is formed, the side faces of the hole are insulated, and the hole is then filled with a conductive material.

Furthermore, currently, there is an increasing number of through-electrode structures in which, as a method for extracting electrodes to the rear surface after completing the semiconductor element, conductive paths are formed by passing through the silicon base material only, while leaving a thin electrode film on the rear surface side which is opposite to the surface where the semiconductor element is formed.

FIG. 7 is a cross-sectional diagram showing a conventional through-electrode composition.

In FIG. 7, numeral 1 denotes a substrate, 2 denotes a through hole, 3 denotes a conductor layer to which a binder has been added, and 4 denotes a conductor layer which does not include a binder.

In forming a conventional through-electrode, firstly, a through hole 2 is formed between the front surface of the substrate 1 on which the semiconductor element (not illustrated) is formed and the rear surface of the substrate 1 on which the electrode pad (not illustrated) constituting the external electrode is formed. Thereupon, a conductor layer 3 having an added binder is formed on the side walls of the through hole 2, and a conductor layer 4 which does not contain a binder is formed in the interior space which is surrounded by the conductor layer 3 with added binder, thereby forming a through-electrode. Finally, the electrode of the semiconductor element (not illustrated) and the electrode pad (not illustrated) are electrically connected by means of the through-electrode.

However, in the conventional composition, a conductor layer or resin is formed following the through hole, and a concavo-convex shape of indentations and projections is not formed in the conductor layer or the front surface of the resin. Therefore, the contact surface area of the interface between the inner surface of the through hole and the conductor layer or resin becomes small, and if an external stress, such as a thermal cycle, occurs, then the adhesiveness at the interface declines, and as a result, detachment occurs at the interface between the through hole and the filing material, cracks and fractures appear in the material, and there is a danger that connection defects will ensue. Furthermore, moisture infiltrates into the interface between the through hole and the filling material, an ion component is left in the device due to immersion in liquid, and hence there is a risk of leak defects due to corrosion.

Moreover, conventional compositions are based on the premise that the hole passes through the substrate, and in the case of a structure where a thin electrode film, such as an electrode pad, is to be formed in the bottom portion of the through hole, air bubbles are left in the bottom portion of the through hole and there is a risk that conductivity cannot be guaranteed satisfactorily.

Moreover, if conductive material is filled into through holes by printing, then due to the incorporation of air in the rolling of the printing material, air bubbles are left between the side walls of the through holes and the filling material, and there is a risk that water, or the like, will infiltrate, giving rise to corrosion of the metal or a decline in insulating properties due to the ion components contained in the water. Moreover, since the amount of filled material varies with the printing pressure, then the filling amount is non-uniform, and there is a risk that the thickness of the insulating material will become small, giving rise to insulation failures.

Moreover, if the filling material is supplied by squeegee, then insulating material and conductive material are left as residues on the surface of the substrate, and hence there is a risk of conduction problems.

Furthermore, if a conductor layer is formed by electroplating, then after forming an adhesive layer and seed layer which are necessary for forming a plating layer by sputtering or vapor deposition, an electroplating step is carried out by a wet process, and therefore the process is long, ion components are left in the device due to the immersion in liquid, and hence there is a risk of leak defects.

Furthermore, a conventional insulating film has a small film thickness, since the insulating layer is formed by a thin film forming process, such as CVD. Therefore if a current of 1A or higher is passed, a leak current may flow in portions where the insulating film has a small thickness due to variation in the thickness of the insulating film, thus giving rise to defects.

Moreover, since the process in conventional methods uses a large amount of indirect materials, such as photoresist masking, then time is required to switch between different machines, the defect rate is high due to the large amount of work input involved, and costs are also high.

Furthermore, in cases where the filling of the resin is carried out by an inkjet deposition method in order to resolve problems of this kind, if an inkjet deposition method is used to fill resin into a semiconductor IC having pad electrodes, on the semiconductor element forming surface side thereof, then the semiconductor element forming surface is open and exposed and therefore material projects onto or adheres to this semiconductor element forming surface, thus giving rise to problems such as conduction errors and insulating defects.

SUMMARY OF THE INVENTION

The present invention was devised in view of the problems of the prior art, an object thereof being to provide a through-electrode forming method for forming an electrode path from the front surface to the rear surface of a semiconductor IC, in which it is possible to suppress mechanical defects, such as detachment of conductive material at the interfaces between the inner face of the through hole and the resin or conductor layer, and the like, and electrical defects, such as insulation defects, conduction defects, and the like.

In order to achieve the aforementioned object, the semiconductor through-electrode forming method according to the present invention is a method of forming a semiconductor through-electrode for electrically connecting an electrode of a semiconductor element formed on the front surface of a substrate to an electrode pad formed on the rear surface of the substrate, the method comprising the steps of: forming a through hole in the substrate above the electrode pad; forming, by an inkjet deposition method, insulating resin by forming one layer of an insulating resin paste having an irregular shape containing concavo-convex indentations and projections on the surface of the substrate, following an inner circumference of the through hole from the surface of the substrate, such that a space is formed in the central portion of the through hole; filling, from the surface of the substrate, the space with one layer of the conductive resin of one or a plurality of conductive resin pastes having an irregular shape containing concavo-convex indentations and projections on the surface of the substrate by an inkjet deposition method; and forming laminated layers by successively repeating the step of forming insulating resin and the step of filling conductive resin until the insulating resin paste and the conductive resin paste are filled into the through hole to reach the front surface of the substrate.

Furthermore, in the step of forming the insulating resin, a thickness in the diameter direction of the through hole of the insulating resin to be formed in the region of the central portion in the depth direction of the through hole is made greater than a thickness in peripheral portions.

Furthermore, in the step of forming the insulating resin, the thickness in the diameter direction of the through hole of the insulating resin to be formed in the region of the central portion in the depth direction of the through hole is made smaller than the thickness in the peripheral portions.

Furthermore, the thickness in the diameter direction of the through hole of the insulating resin in the step of forming insulating resin is made larger and smaller alternately in the step of forming laminated layers.

Moreover, the through hole is formed such that the size of the through hole in the diameter direction becomes continuously smaller from the front surface side of the substrate toward the rear surface side of the substrate.

Furthermore, the conductive resin paste is gold (Au), copper(Cu) or silver(Ag).

Moreover, the depositing positions are staggered between layers during the deposition of the insulating resin paste and the conductive resin paste.

Moreover, the deposition volume is changed between layers during the deposition of the insulating resin paste and the conductive resin paste.

DESCRIPTION OF THE PREFERRED EMBODIMENTS

Below, embodiments of the present invention are described with reference to the drawings.

First Embodiment

Firstly, a semiconductor through-electrode forming method according to a first embodiment of the present invention will be described with reference to FIG. 1A, FIG. 1B, FIG. 2, FIG. 3A and FIG. 3B.

Figure 1A:
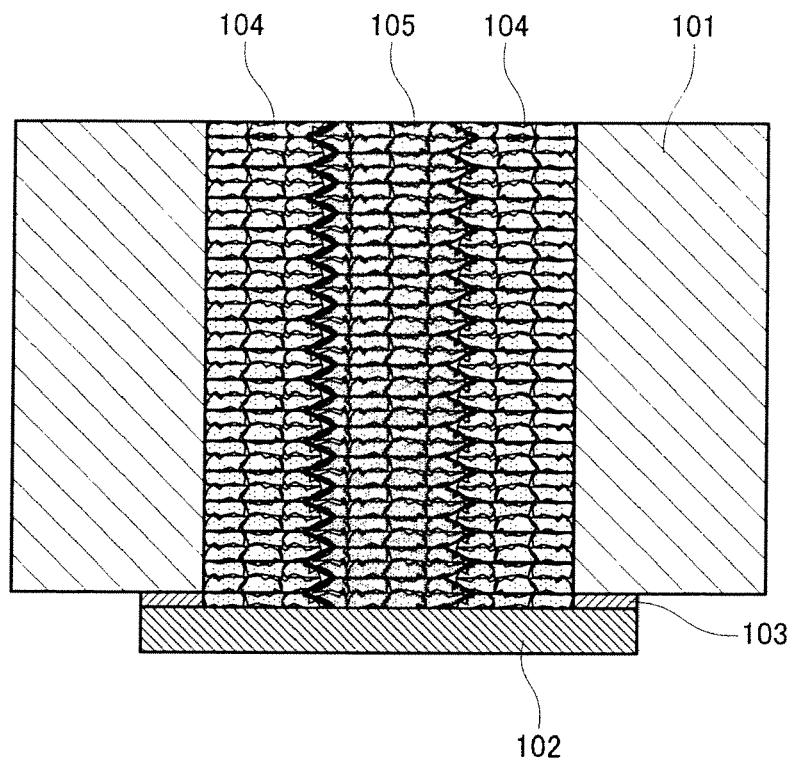
FIG. 1A is a cross-sectional diagram showing the composition of a through-electrode according to a first embodiment.
Figure 1B:
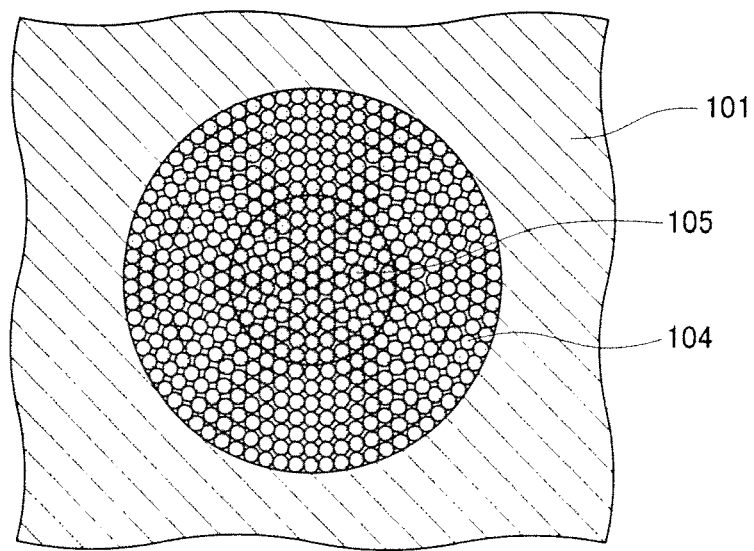
FIG. 1B is a cross-sectional diagram showing the composition of the through-electrode according to the first embodiment.
Figure 2:
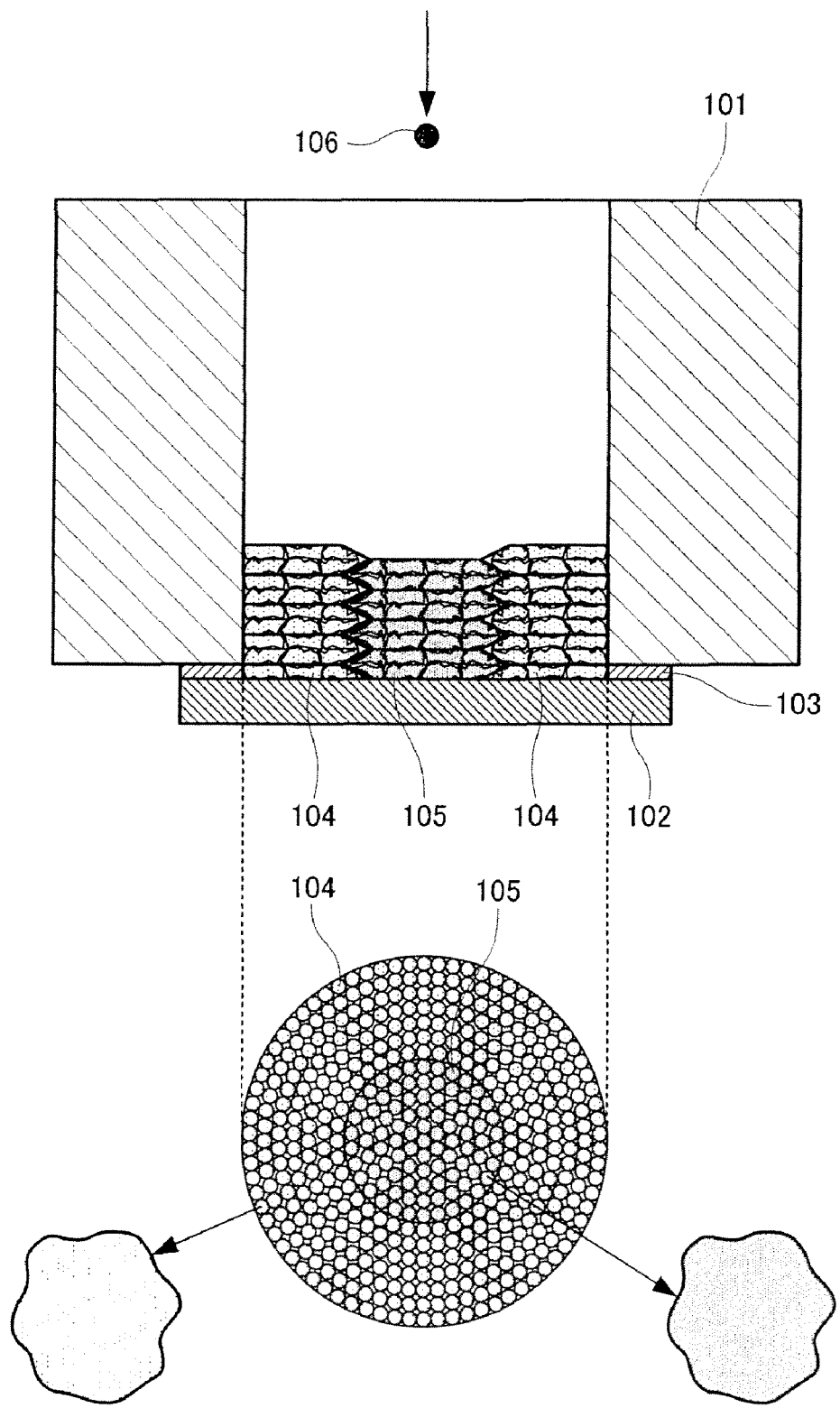
FIG. 2 is a diagram illustrating inkjet-ejected resins which form the through-electrode according to the first embodiment of the present invention.
Figure 3A:
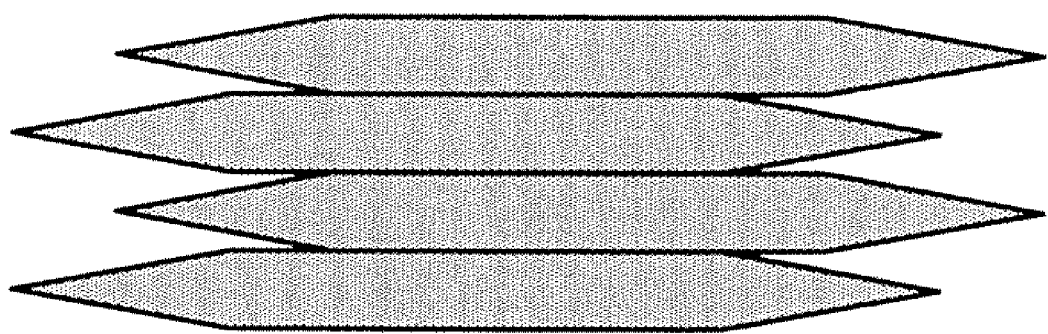
FIG. 3A is a diagram illustrating a method of forming concavo-convex indentations and projections in the surface of the insulating resin and the conductive resin according to the present invention.
Figure 3B:
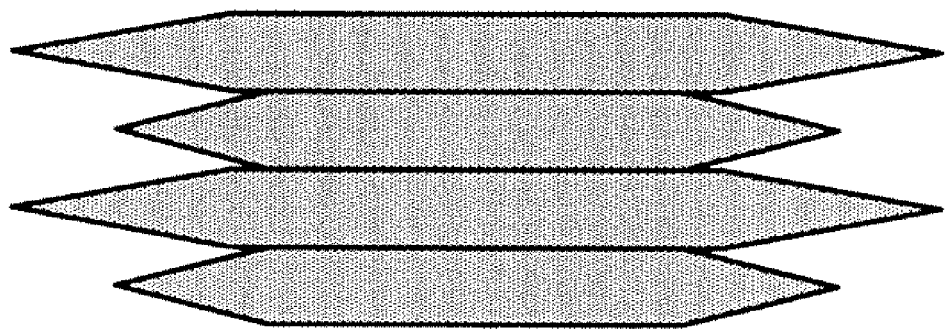
FIG. 3B is a diagram illustrating a method of forming concavo-convex indentations and projections in the surface of the insulating resin and the conductive resin according to the present invention.

FIGS. 1A and 1B are cross-sectional diagrams showing the composition of a through-electrode according to the first embodiment, and FIG. 2 is a diagram illustrating resin ejected by an inkjet method which forms the through-electrode according to the first embodiment. Furthermore, FIG. 3A and FIG. 3B are diagrams illustrating a method of forming a concavo-convex shape in the surface of the insulating resin and the conductive resin according to the present invention.

In FIG. 1A, FIG. 1B and FIG. 2, reference numeral 101 is a silicon device, 102 is an electrode pad formed on the rear surface, 103 is a silicon oxide film, 104 is an insulating material, 105 is a conductive material, and 106 is an inkjet-ejected resin; conduction between the electrode of the semiconductor element formed on the front surface and the electrode pad 102 is guaranteed while insulating the silicon device 101 from the electrode pad 102 by means of the silicon oxide film 103.

The insulating material 104 and the conductive material 105 are applied alternatively by an inkjet method, and are laminated so as to be stacked upon each other.

Firstly, in order to connect the electrode of the semiconductor element formed on the front surface to the electrode pad 102 on the rear surface, a through hole is formed passing through the silicon device 101 at the position where the electrode pad 102 is formed, whereupon an electrode pad 102 is formed on the rear surface side of the through hole, on the opposite side to the semiconductor element forming surface, insulating material 104 is formed in the peripheral portion of the through hole, conductive material 105 is formed in the central portion of the through hole, and finally, the conductive material 105 and the electrode of the semiconductor element are connected electrically, thereby forming a through-electrode which extracts the electrode of the semiconductor element on the front surface of the substrate to the electrode pad 102 on the rear surface of the substrate.

The conductive material 105 is a conductive paste made of gold, silver, copper, or the like, and the insulating material 104 is an organic material having a volumetric resistance value of 10e4 ohm/cm or more. The insulating material 104 is formed in the periphery of the through hole and the conductive material 105 is formed in the central portion of the through hole, by an inkjet deposition method, in a stacked fashion. In order to improve the bonding strength, the applied insulating material 104 and conductive material 105 are formed with a cross-sectional shape that is not round, but rather has irregular concavo-convex projections and indentations. Alternatively, a concavo-convex shape is applied to the surface of the insulating resin and conductive resin formed by the insulating material 104 and the conducting material 105.

As shown in FIG. 2, when the ejection volume of inkjet-ejected resin 106 is ⅕ pl, then the inkjet-ejected resin 106 which is deposited on the bottom surface of the through hole has a diameter in the range of approximately 30 to 50 μm, a height of up to approximately 0.17 μm in the tallest portion, and a surface containing irregular concavo-convex projections and indentations. In the case of the insulating material 104, the inkjet-ejected resin 106 is deposited one droplet at a time onto the electrode pad 102 while moving in a circular fashion about the periphery of the through hole, starting from the electrode pad 102 side of the through hole, and each time one layer has been deposited, then one layer of one or a plurality of conductive materials 105 is deposited inside the previously deposited insulating material 104, in a circular fashion in the center of the through hole. This operation is repeated in such a manner that layers of insulating material 104 and layers of conductive material 105 are laminated on each other, and an insulating resin made of an insulating material 104 and a conductive resin made of a conductive material 105 are filled into the through holes. Moreover, after filling the insulating material 104 and the conductive material 105, heat is applied and the resins of the insulating material 104 and conductive material 105 are cured.

Here, concavo-convex indentations and projections are formed in the surface shape of the inkjet-ejected resins 106, but it is also possible to impart a concavo-convex shape to the surface of the laminated insulating resin or conductive resin. For this purpose, it is also possible to provide a concavo-convex shape in the surface of the laminated insulating resin or conductive resin, by respectively staggering the supply range by one to several μm between each laminated layer, when ejecting the inkjet-ejected resin 106, as shown in FIG. 3A. Furthermore, it is also possible to provide a concavo-convex shape in the surface of the laminated insulating resin or conductive resin by altering the ejection volume for each laminated layer during the ejection of the inkjet-ejection resin 106 (FIG. 3B).

It is possible to deposit insulating material 104 first and then deposit conductive material 105 in the central portion, or to deposit conductive material 105 in the central portion first and then deposit insulating material 104 in the peripheral portion.

Furthermore, when forming the insulating resin in a circular fashion, it is possible to form the thickness in the diameter direction by means of a plurality of inkjet-ejected resin droplets as shown in FIG. 1A, FIG. 1B and FIG. 2, and it is also possible to adjust the ejection volume in such a manner that the width of one inkjet-ejected resin layer forms the required thickness. In a similar fashion, it is possible to form conductive resin for one layer by means of one inkjet-ejected resin droplet, and it is also possible to form conductive resin for one layer by means of a plurality of inkjet-ejected resin droplets.

As described above, when filling an insulating resin and a conductive resin into a through hole having an electrode pad formed in the bottom portion thereof, by filling inkjet-ejected resins having an irregular shape by means of an inkjet deposition method so as to laminate together respective layers each formed by an insulating resin disposed in the peripheral portion of the through hole and a conductive resin disposed inside the insulating resin, then the laminated portions have a complex shape and therefore the adhesiveness between the resin and the surface of the through hole and the adhesiveness between the respective resins are improved, thereby preventing the risk of detachment due to external stresses, in addition to which, by supplying material only to portions where it is required, it is possible to prevent resin from projecting out onto the front surface, and in a through-electrode forming method for forming an electrode path from the front surface to the rear surface of a semiconductor IC, it is possible to suppress the occurrence of mechanical defects, such as detachment of the conductive material at the interface between the inner surface of the through hole and the resin or the conductive layer, and electrical defects such as insulation defects, conduction defects, or the like.

Second Embodiment

Figure 4:
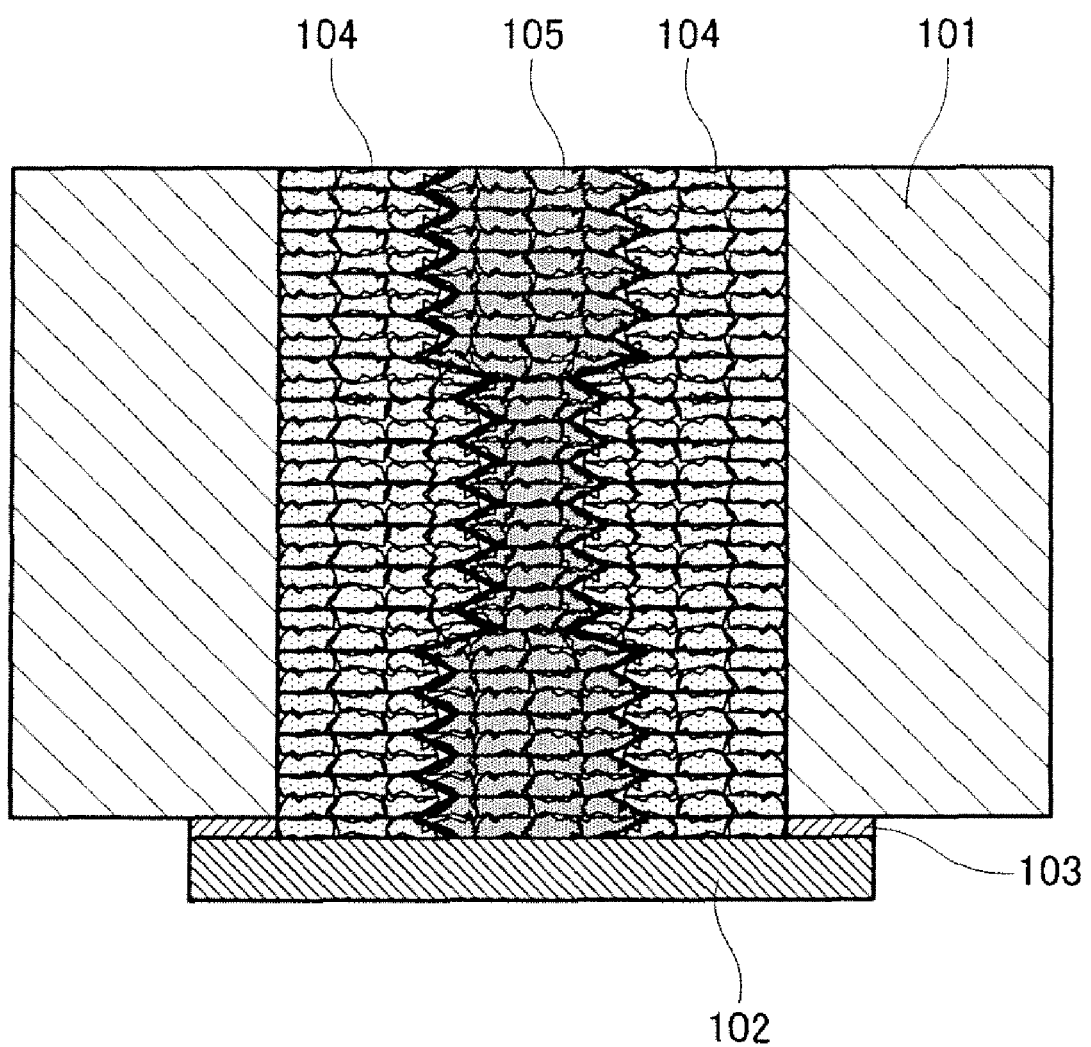
FIG. 4 is a cross-sectional diagram showing the composition of a through-electrode according to a second embodiment.

FIG. 4 is a cross-sectional diagram showing the composition of a through-electrode according to a second embodiment.

In FIG. 4, constituent elements which are the same as those in FIG. 1 and FIG. 2 are labelled with the same reference numerals and further description thereof is omitted.

As shown in FIG. 4, in addition to the composition of the first embodiment, in the through-electrode according to the second embodiment, insulating material 104 is filled so as to increase the width of the insulating material in the central portion in the depth direction of the through-electrode, and in corresponding fashion, conductive material 105 is filled so as to reduce the diameter of the conductive material in the central portion in the depth direction of the through-electrode. In this case, the thickness can be adjusted by means of the volume per ejection or the number of ejections of the inkjet-ejected resin.

In this way, by making the width of the insulating resin greater and making the diameter of the conductive resin narrower in the central portion of the depth direction of the through-electrode, the concavo-convex shapes of the surfaces of the respective materials intertwine with each other, thus creating a structure which provides resistance to external stresses, and hence it is possible to prevent the risk of detachment of the insulating material 104 or conductive material 105 due to external stresses, and therefore to suppress mechanical defects, such as peeling apart of the conductive material at the interface between the inner surface of the through hole and the resin or conductive layer, and electrical defects, such as insulation defects, conduction defects, and the like.

Third Embodiment

Figure 5A:
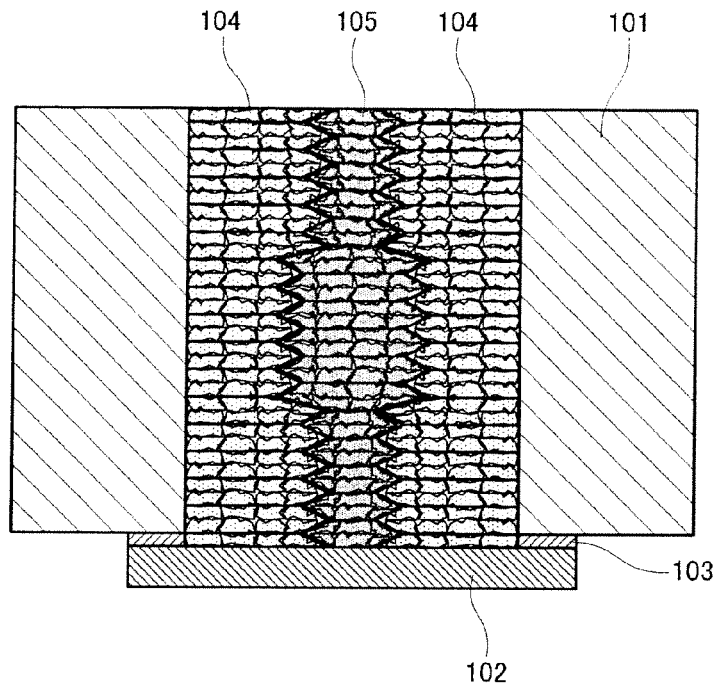
FIG. 5A is a cross-sectional diagram showing the composition of a through-electrode according to a third embodiment.
Figure 5B:
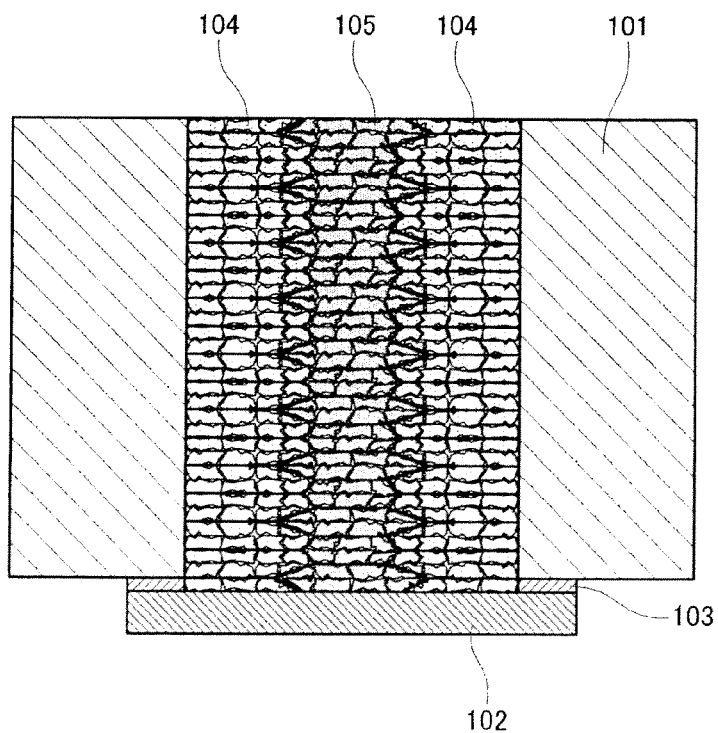
FIG. 5B is a cross-sectional diagram showing the composition of the through-electrode according to the third embodiment.

FIGS. 5A and 5B are cross-sectional diagrams showing the composition of a through-electrode according to a third embodiment; FIG. 5A is a diagram showing a composition where the diameter of the conductive material is made greater in the central portion of the through-electrode, and FIG. 5B is a diagram showing a composition where the diameter of the conductive material is made greater in alternating fashion.

In FIG. 5A and FIG. 5B, the same reference numerals are used for constituent elements which are the same as those in FIG. 1A, FIG. 1B, FIG. 2, FIG. 3A, FIG. 3B and FIG. 4, and further description thereof is omitted here.

As shown in FIG. 5A, in the through-electrode according to the third embodiment, contrary to the second embodiment, insulating material 104 is filled so as to reduce the width of the insulating material in the central portion in the depth direction of the through-electrode, and in corresponding fashion, conductive material 105 is filled so as to increase the diameter of the conductive material in the central portion in the depth direction of the through-electrode.

In this way, by making the width of the insulating resin narrower and making the diameter of the conductive resin wider in the central portion of the depth direction of the through-electrode, the concavo-convex shapes of the surfaces of the respective materials intertwine with each other, thus creating a structure which provides resistance to external stresses, and hence it is possible to prevent the risk of detachment of the insulating material 104 or conductive material 105 due to external stresses, and therefore to suppress mechanical defects, such as peeling apart of the conductive material at the interface between the inner surface of the through hole and the resin or conductive layer, and electrical defects, such as insulation defects, conduction defects, and the like.

Furthermore, as shown in FIG. 5B, in addition to the composition of the first embodiment, the diameter of the conductive resin 105 is made alternately larger and smaller in each of the layers constituted by the insulating material 104 and conductive material 105.

In this way, by making the diameter of the conductive material 105 larger and smaller alternately in each layer, the concavo-convex shapes of the surfaces of the respective materials intertwine with each other, thus creating a structure which provides resistance to external stresses, and hence it is possible to prevent the risk of detachment of the insulating material 104 or conductive material 105 due to external stresses, and therefore to suppress mechanical defects, such as peeling apart of the conductive material at the interface between the inner surface of the through hole and the resin or conductive layer, and electrical defects, such as insulation defects, conduction defects, and the like.

In the present embodiment, the thickness can be adjusted by means of the volume per ejection or the number of ejections of the inkjet-ejected resin.

Fourth Embodiment

Figure 6:
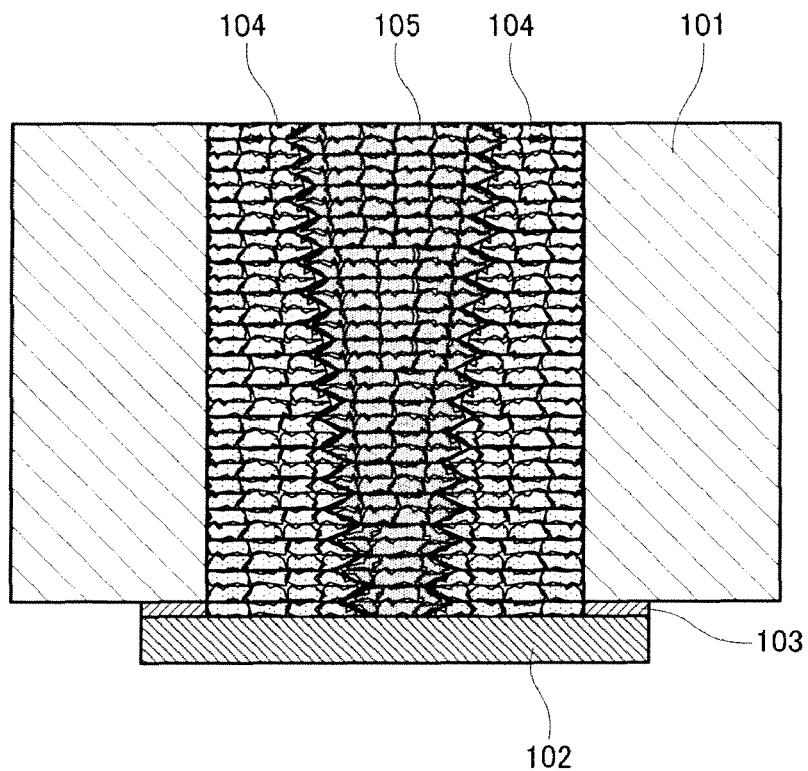
FIG. 6 is a cross-sectional diagram showing the composition of a through-electrode according to a fourth embodiment.
Figure 7:
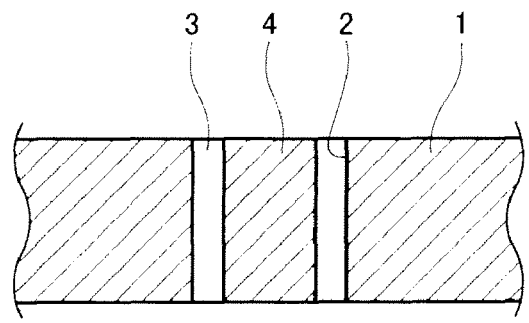
FIG. 7 is a cross-sectional diagram showing a conventional through-electrode composition.

FIG. 6 is a cross-sectional diagram showing the composition of a through-electrode according to a fourth embodiment.

In FIG. 6, the same reference numerals are used for constituent elements which are the same as those in FIG. 1A, FIG. 1B, FIG. 2, FIG. 3A, FIG. 3B, FIG. 4, FIG. 5A and FIG. 5B and further description thereof is omitted here.

As shown in FIG. 6, in addition to the compositions shown in the first to third embodiments, in the through-electrode according to the fourth embodiment, the through-electrode is formed in a tapered shape which narrows toward an electrode pad 102, and conductive material 105 is filled in such a manner that the diameter thereof becomes smaller toward the electrode pad 102, in accordance with the diameter of the through-electrode.

As described above, by filling the conductive material in such a manner that the diameter thereof reduces toward the electrode pad in accordance with the diameter of the through-electrode, the thickness of the insulating material is guaranteed while sufficiently ensuring the volume of the conductive path, and therefore both electrical insulating properties and conducting properties are ensured, while at the same time, the risk of detachment due to external stresses is prevented and it is possible to prevent mechanical defects, such as peeling apart of the conductive material at the interfaces between the inner surface of the through hole and the resin or conductive layer, as well as electrical defects such as insulation defects, conduction defects, and the like.

Furthermore, in the respective embodiments described above, since the insulating resin and conductive resin are formed by an inkjet method, then it is possible to prevent problems, such as decline in the insulating properties due to the infiltration of water, insulation failures due to reduced thickness of the insulating material, conduction faults due to the presence of residue of conductive material, increased processing time in order to carry out electroplating by a wet process, leak defects due to the presence of residual ion components in the device, leakage current defects in the portions where the insulating film is thin, or increase in the defect rate, and so on.

What is claimed is:

1. A method of forming a through-electrode for electrically connecting an electrode of a semiconductor element on a front surface of a substrate to an electrode pad on a rear surface of the substrate, the method comprising:
forming a through hole in the substrate above the electrode pad;
forming by inkjet deposition a layer of an insulating resin paste, around an inner circumference of the through hole leaving a space in a central portion of the through hole;
filling by inkjet deposition the space with a layer of one or a plurality of conductive resin pastes; and
forming laminated layers by successively repeating the step of forming the layer of insulating resin paste and the step of filling the space with the layer of the one or the plurality of conductive resin pastes until the insulating resin paste and the one or a plurality of conductive resin pastes filled into the through hole reach the front surface of the substrate,
wherein after forming insulating resin and conductive resin, an interface between the insulating resin and the conductive resin includes concavo-convex indentations and projections.

2. The method of forming the through-electrode according to claim 1, wherein, after forming the laminated layers, a first thickness of the insulating resin in a direction along a diameter of the through hole near the top of the through hole is larger than a second thickness in a direction along the diameter of the through hole near the axial middle of the through hole.

3. The method of forming the through-electrode according to claim 1, wherein, after forming the laminated layers, a first thickness of the insulating resin in a direction along a diameter of the through hole near the top of the through hole is smaller than a second thickness in a direction along the diameter of the through hole near the axial middle of the through hole.

4. The method of forming the through-electrode according to claim 1, wherein after forming the laminated layers, a thickness of the insulating resins in a direction along diameters of the through hole is alternately larger and smaller along the axial length of the through hole.

5. The method of forming the through-electrode according to claim 1, wherein after forming the laminated layers, the diameter of the is continuously smaller from the front surface side of the substrate toward the rear surface side of the substrate.

6. The method of forming the through-electrode according to claim 1, wherein the conductive resin paste comprises gold (Au), copper (Cu) or silver (Ag).

7. The method of forming the through-electrode according to claim 1, wherein depositing positions are staggered between layers during the deposition of the insulating resin paste and the conductive resin paste.

8. The method of forming the through-electrode according to claim 1, wherein the deposition volume of resin paste is varied between layers during the deposition of insulating resin paste and conductive resin paste.

* * * * *